(12) United States Patent
Seon (10) Patent No.: US 9,490,632 B2
(45) Date of Patent: Nov. 8, 2016

(54) SOLAR DEVICE

(71) Applicant: LSIS CO., LTD, Anyang-si, Gyeonggi-do (KR)

(72) Inventor: Jong Kug Seon, Suwon-si (KR)

(73) Assignee: LSIS CO., LTD, Anyang-si (KR)

( * ) Notice: Subject to any disclaimer, the term of this patent is extended or adjusted under 35 U.S.C. 154(b) by 631 days.

(21) Appl. No.: 13/689,245

(22) Filed: Nov. 29, 2012

(65) Prior Publication Data

US 2013/0134782 A1    May 30, 2013

(30) Foreign Application Priority Data

Nov. 29, 2011  (KR) .................. 10-2011-0125935

(51) Int. Cl.
*H01H 47/00* (2006.01)
*H02J 1/00* (2006.01)
(Continued)

(52) U.S. Cl.
CPC . *H02J 1/00* (2013.01); *G05F 3/08* (2013.01); *H01L 31/02021* (2013.01); *H02J 1/12* (2013.01); *H02J 3/385* (2013.01); *H02M 7/44* (2013.01); *H04B 3/54* (2013.01); *H04B 3/548* (2013.01); *H04B 2203/5445* (2013.01); *H04B 2203/5458* (2013.01);
(Continued)

(58) Field of Classification Search
CPC ............ Y02E 10/58; H02J 1/00; G05F 3/08; H02M 7/44; H01L 31/02021
USPC ........................................................ 307/130
See application file for complete search history.

(56) References Cited

U.S. PATENT DOCUMENTS 4,157,576 A * 6/1979 Hack et al. ................. 360/77.11
4,203,395 A * 5/1980 Cromas et al. .......... 123/339.24
(Continued)

FOREIGN PATENT DOCUMENTS

CN    102129265    7/2011
CN    201904742    7/2011
(Continued)

OTHER PUBLICATIONS

Burger, et al., "Module Integrated Electronics—An Overview," 25th European Photovoltaic Solar Energy Conference and Exhibition/5th World Conference on Photovoltaic Energy Conversion, XP040531783, Sep. 2010, pp. 3700-3707.
(Continued)

*Primary Examiner* — Scott Bauer
*Assistant Examiner* — Tien Mai
(74) *Attorney, Agent, or Firm* — Lee, Hong, Degerman, Kang & Waimey (57) ABSTRACT

A solar device is provided. The solar device includes a solar module configured to absorb solar energy to convert the solar energy to electrical energy, a DC converter configured to detect an input voltage output from the solar module and outputs a DC voltage corresponding to a maximum power point through the detected input voltage, an interface unit configured to transmit data including the input voltage detected from the DC converter and the DC voltage corresponding to the maximum power point, a data combiner configured to combine and transmit data on the solar module with the data received from the interface unit, a data synthesizer configured to remove a DC voltage offset from the data received from the data combiner, and a data controller configured to track a maximum power point using data from which the DC voltage offset has been removed.

8 Claims, 12 Drawing Sheets

(51) Int. Cl.
  *G05F 3/08* (2006.01)
  *H02M 7/44* (2006.01)
  *H01L 31/02* (2006.01)
  *H02J 3/38* (2006.01)
  *H02J 1/12* (2006.01)
  *H04B 3/54* (2006.01)

(52) U.S. Cl.
  CPC ....... *H04B 2203/5483* (2013.01); *Y02E 10/58* (2013.01); *Y10T 307/406* (2015.04); *Y10T 307/707* (2015.04)

(56) References Cited

U.S. PATENT DOCUMENTS

| | | | |
|---|---|---|---|
| 6,087,579 A * | 7/2000 | Muskatevc | 136/251 |
| 2002/0167693 A1* | 11/2002 | Vrazel et al. | 359/109 |
| 2003/0185330 A1* | 10/2003 | Hessel et al. | 375/376 |
| 2005/0246510 A1* | 11/2005 | Retnamma et al. | 711/162 |
| 2010/0127570 A1 | 5/2010 | Hadar et al. | |
| 2011/0127841 A1 | 6/2011 | Chiang et al. | |

FOREIGN PATENT DOCUMENTS

| | | |
|---|---|---|
| JP | 08-123561 | 5/1996 |
| JP | 11-065687 | 3/1999 |
| JP | 2010-521720 | 6/2010 |
| JP | 4561928 | 10/2010 |
| JP | 2011-507465 | 3/2011 |
| JP | 2011-107904 | 6/2011 |
| JP | 2011-199980 | 10/2011 |
| JP | 2011-238087 | 11/2011 |
| JP | 2011-238088 | 11/2011 |
| KR | 10-2007-0033395 | 3/2007 |

OTHER PUBLICATIONS

Orduz, et al., "Evaluation Test Results of a New Distributed MPPT Converter," 22nd European Photovoltaic Solar Energy Conference, XP040513575, Sep. 2007, pp. 2826-2829.
European Patent Office Application Serial No. 12194195.9, Search Report dated May 28, 2014, 8 pages.
The State Intellectual Property Office of the People's Republic of China Application Serial No. 201210500760.X, Office Action dated Jun. 4, 2014, 6 pages.
Korean Intellectual Property Office Application Serial No. 10-2011-0125935, Notice of Allowance dated Nov. 12, 2013, 2 pages.
Japan Patent Office Application Serial No. 2012-259500, Office Action dated Dec. 17, 2013, 4 pages.

* cited by examiner

SOLAR DEVICE

CROSS-REFERENCE TO RELATED APPLICATIONS

Pursuant to 35 U.S.C. §119(a), this application claims the benefit of earlier filing date and right of priority to Korean Patent Application No. 10-2011-0125935, filed on Nov. 29, 2011, the contents of which is hereby incorporated by reference herein in its entirety.

BACKGROUND

The present disclosure relates to a solar device.

Recently, as the depletion of natural resources and problems with environment and stability related to thermal and nuclear power generation emerge, studies on sunlight and wind power that are typical environmentally-friendly green energy are actively ongoing. In particular, solar generation is significantly coming into the limelight in that it is infinite and green energy. In addition, the solar generation is utilized for very various purposes, such as an unmanned lighthouse, a clock tower, a communication device, etc. that are remote from a power system line, as well as a vehicle, a toy, residential generation, a street lamp.

However, the generation efficiency of a solar cell that converts solar energy to power is just on the order of 10%. Thus, how we will efficiently obtain solar energy is an urgent problem.

Solar cell converts solar energy to electrical energy and is a special power source that may not be said to be a voltage source or a current source. When a general linear voltage source is used, desired operating conditions may be obtained regardless of load conditions.

Since the solar cell is a typical non-linear source, the power generated from the solar cell has a characteristic that its magnitude changes according to load conditions, the amount of sunlight, or surrounding temperatures.

Thus, a technology has been required to track and fix a maximum power point (MPP) where largest effective power may be obtained from the solar cell.

However, since a solar device that uses wireless communication according to the related art requires a wireless communication device and a relay, it has disadvantages that a related cost increases and there are many constraints on an installation environment. In addition, since a solar device that uses wired communication according to the related art requires a communication-dedicated cable line, it has disadvantages that a related cost increases and it is difficult to install and maintain the solar device.

In addition, a maximum power tracking/control device according to the related art requires many parts, such as current and voltage value detectors for each of input and output and a plurality of A/D converters. This serves as a main reason for an increase in cost.

SUMMARY

Embodiments provide a solar device that transceiver data through a DC cable line installed between a solar module and a DC/AC converter or between a DC converter and the DC/AC converter to efficiently perform the cost decrease, installation and maintenance of the solar device.

In one embodiment, a solar device includes: a solar module configured to absorb solar energy to convert the solar energy to electrical energy, a DC converter configured to detect an input voltage output from the solar module and outputs a DC voltage corresponding to a maximum power point through the detected input voltage, an interface unit configured to transmit data including the input voltage detected from the DC converter and the DC voltage corresponding to the maximum power point, a data combiner configured to combine and transmit data on the solar module with the data received from the interface unit, a data synthesizer configured to remove a DC voltage offset from the data received from the data combiner, and a data controller configured to track a maximum power point using data from which the DC voltage offset has been removed.

Embodiments have the following effects.

First, embodiments may perform the tracking of the maximum power point of a DC converter using a DC cable line, simply and efficiently.

Second, embodiments may build a solar device at a low cost by simplifying the configuration of a DC converter.

The details of one or more embodiments are set forth in the accompanying drawings and the description below. Other features will be apparent from the description and drawings, and from the claims.

DETAILED DESCRIPTION OF THE EMBODIMENTS

Exemplary embodiments will be described in detail with reference to the accompanying drawings below so that those skilled in the art may easily practice.

Figure 1:
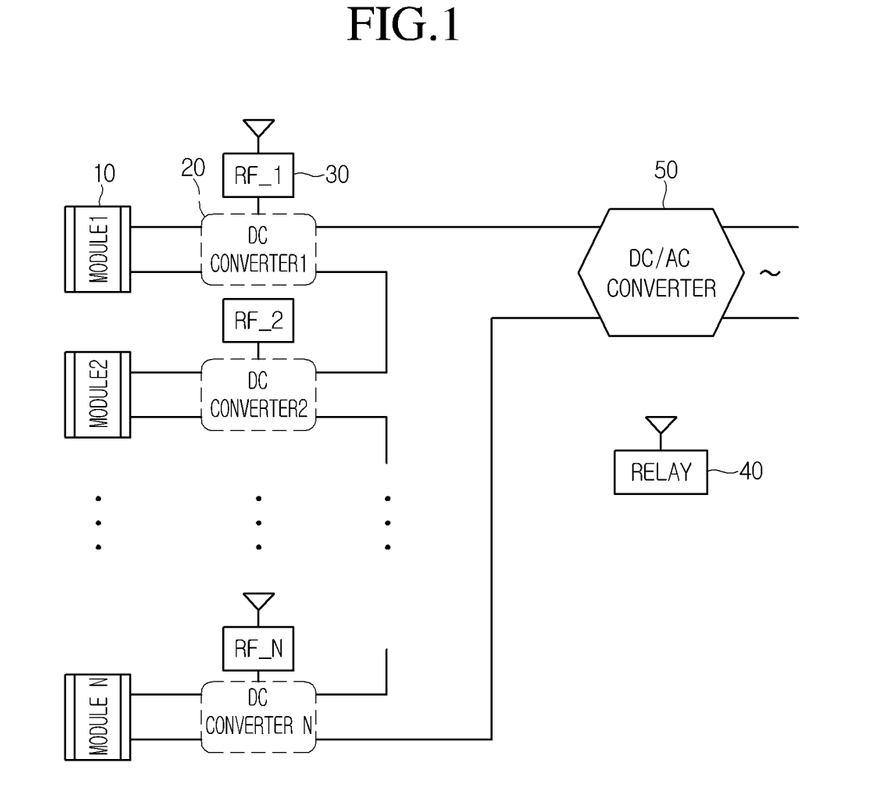
FIG. 1 is a view illustrating a configuration of a solar device according to an embodiment.

FIG. 1 is a view illustrating a configuration of a solar device according to an embodiment.

Referring to FIG. 1, the solar device includes a plurality of solar modules 10, a plurality of DC converters 20, a plurality of RF communication units 30, a relay 40, and a DC/AC converter 50. In an embodiment, the components in the solar device are connected to one another in a string form, and a plurality of solar devices where the components are connected to one another in a string form may configure a plurality of arrays in parallel.

In an embodiment, the solar module 10 is a module to absorb solar energy and may be a solar cell.

In an embodiment, the solar module 10 may be made of a wafer that is made of silicon.

Each solar module 10 may be located at different positions depending on the sunshine conditions or temperature conditions of each solar device. In an embodiment, the solar module 10 may be made in a manner that a P-type semiconductor is bonded to an N-type semiconductor. When light is radiated to the solar module 10, holes and electrons are generated at the solar module 10 by energy that light carries. Then, the holes moves to the P-type semiconductor and the electrons move to the N-type semiconductor, so a potential difference arises and current starts to flow.

At this point, the solar module 10 is a module that converts light energy (solar energy) to electrical energy, and has electrical properties that are different from those of general electrical energy sources (typically, an electrical-chemical battery, generator). Since existing electrical energy has properties as a linear voltage source, it keeps a voltage constant and stably operates even if linear or non-linear loads are applied to load terminals. In addition, since it has only one operating point, it always operates as a stable system under any input/output conditions. In other words, when an electrical energy source with a linear voltage source is used, it is possible to obtain desired operating conditions regardless of load conditions. However, since the solar module 10 has properties as a non-linear source that is different from existing electrical energy, it does not keep a voltage constant if a linear or non-linear load is applied to load terminals. In addition, the solar device may unstably operate and have various operating points, for example.

The DC converter 20 may track a maximum power point that is output from the solar module 10. The DC converter 20 may include an input detector 21 and an output detector that will be described above.

In an embodiment, the DC converter 20 may use a voltage or current value detected by the input detector 21 and a voltage or current value detected by the output detector 23 to track the maximum power point where each solar module 10 outputs maximum power.

A detailed configuration of the DC converter 20 will be described below.

The RF communication unit 30 receives information on an input voltage, input current, an output voltage, output current, input power, and output power measured by each DC converter 20, and the tracked maximum power point, to the relay 40.

The relay 40 transmits information on an input voltage, input current, an output voltage, output current, input power, and output power measured by each DC converter 20, and the tracked maximum power point, from the RF communication unit 30. In addition, the relay 40 may receive information that each solar module 10 has, for example, information on the identifying number (ID) of each solar module 10, the intensity of sunlight that each solar module 10 receives (an amount of solar radiation), and the temperature (surface temperature) of a solar module 10.

The relay 40 may monitor the information in real time and control the solar device to track the maximum power point if each solar device does not output maximum power.

The DC/AC converter 50 converts the received DC power to alternating current and supplies the result to loads.

However, since the solar device using RF communication as described above separately requires the RF communication unit 30 and the relay 40, it has problems that a cost increases and there are many constraints on its installation requirement.

Figure 2:
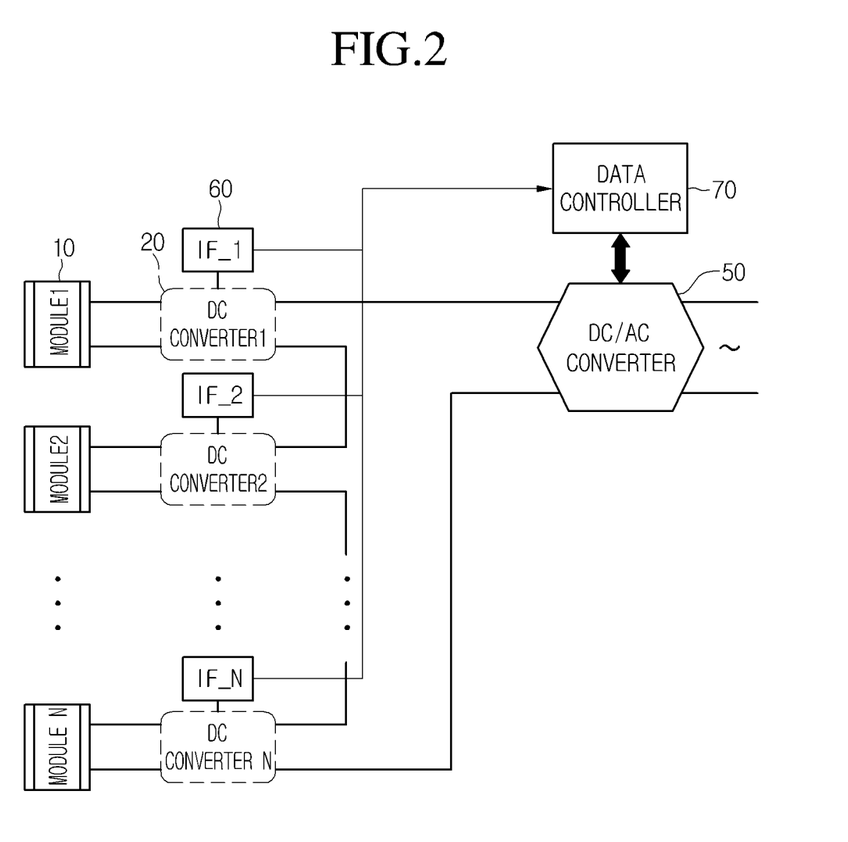
FIG. 2 is a view illustrating a configuration of a solar device according to an embodiment.

FIG. 2 is a view illustrating a configuration of a solar device according to another embodiment.

Referring to FIG. 2, the solar device includes a plurality of solar modules 10, a plurality of DC converters 20, a plurality of wired communication units 60, a DC/AC converter 50, and a data controller 70.

Since the solar module 10, the DC converter 12, and the DC/AC converter 50 have the same configurations as in FIG. 1, their detailed descriptions are not repeated.

Each wired communication unit 60 is connected to one another by wires and transmits information on an input voltage, input current, an output voltage, output current, input power, and output power measured by each DC converter 20, and the tracked maximum power point, to the data controller.

The data controller 70 receives information on an input voltage, input current, an output voltage, output current, input power, and output power measured by each DC converter 20, and the tracked maximum power point, through each wired communication unit 60. In addition, the data controller 70 may receive information that each solar module 10 has, for example, information on the identifying number (ID) of each solar module 10, the intensity of sunlight that each solar module 10 receives (an amount of solar radiation), and the temperature (surface temperature) of a solar module 10.

The data controller 70 may monitor the information in real time and control the solar device to track the maximum power point if each solar device does not output maximum power.

However, since the solar device using wires as described above separately requires a communication-dedicated cable line, it has problems that a cost increases and it is difficult to install and maintain the solar device.

Figure 3:
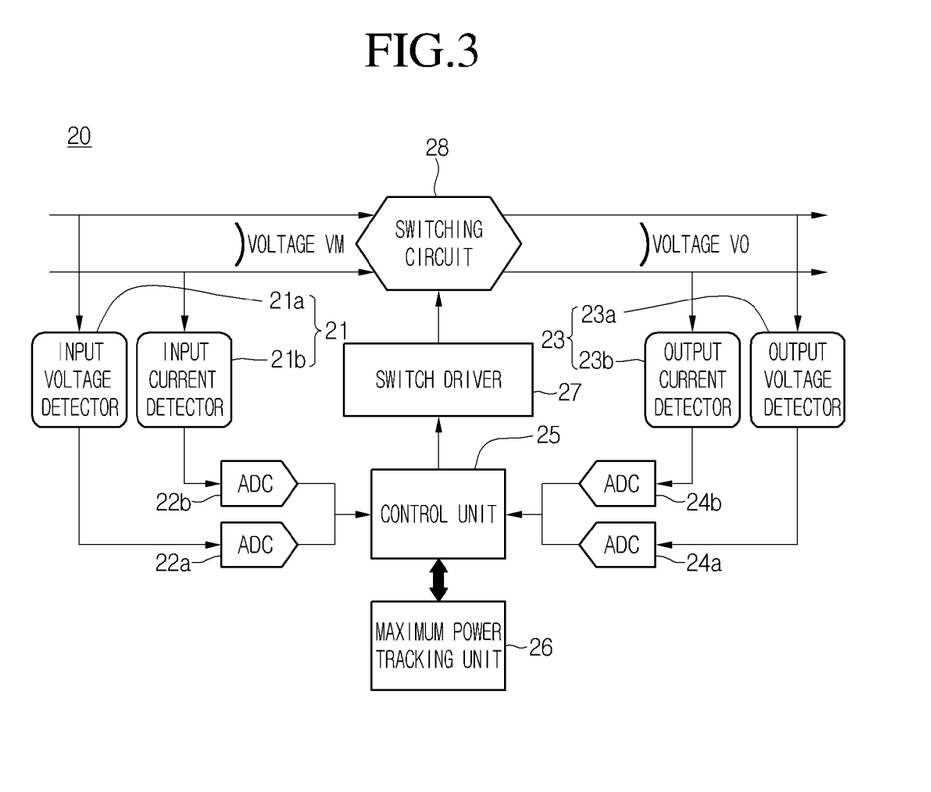
FIG. 3 is a block diagram of a DC converter according to another embodiment.

FIG. 3 is a block diagram of a DC converter according to an embodiment.

The DC converter 20 includes an input detector 21 that includes an input voltage detector 21a and an input current detector 21b, an output detector that includes an output voltage detector 23a and an output current detector 23b, first to fourth A/D converters 22a, 22b, 24a, 24b, a control unit 25, a maximum power tracking unit 26, a switch driver 27, and a switching circuit 28.

The input voltage detector 21a detects a voltage that is output from the solar module 10 and input to the switching circuit 28.

The input current detector 21b detects current that is output from the solar module 10 and input to the switching circuit 28.

The first A/D converter 22a converts an input voltage value input to the switching circuit 28, to a digital value.

The second A/D converter 22b converts an input current value input to the switching circuit 28, to a digital value.

The output voltage detector 23a detects a voltage that is output from the switching circuit 28.

The output current detector 23b detects current that is output from the switching circuit 28.

The third A/D converter 24a converts an output voltage value output from the switching circuit 28, to a digital value The fourth A/D converter 24b converts an output current value output from the switching circuit 28, to a digital value.

The maximum power tracking unit 26 uses an input power value and an output power value to track a maximum power point that the solar module 10 may output.

The switching circuit 28 may change the magnitude of the power that is input from the solar module 10 to loads. In an embodiment, the switching circuit 28 may be realized as a transistor, for example, FET, MOSFET, or IGBT.

The control unit 25 may control the overall operations of the DC converter 20.

The control unit 25 may use any one of the input voltage value and input current value, or use the input voltage value and input voltage to generate a control signal for outputting a maximum power point and to transmit the control signal to the maximum power tracking unit 26.

The control unit 25 can use any one of the output voltage value and output current value, or use the output voltage value and output voltage to generate a control signal for outputting a maximum power point and to transmit the control signal to the maximum power tracking unit 26.

The control unit 25 may use the input power value and output power value to generate a control signal for outputting a maximum power point and to transmit the control signal to the maximum power tracking unit 26.

The control unit 25 may control the switching circuit 28 to output a maximum power value tracked from the maximum power tracking unit 26. The switching circuit 28 may change the magnitude of the voltage value and current value that are input from the solar module 10 to loads according to the control of the control unit 25.

The DC converter 20 as described above has a configuration to track a maximum power point, but requires detectors for current values and voltage values for input and output and four A/D converters. Thus, the configuration of the DC converter is complex and its many components acts as a main factor in a cost increase.

In addition, in the solar device depicted in FIGS. 1 to 3, since the same current flows in each solar module 10 and each DC converter 20, it is inefficient to directly detect current from each DC converter 20. Further, since an expensive technique is used for detecting current, the cost of the overall solar device increases if current is directly detected from each DC converter.

Thus, there is a need for a method of decreasing the cost of the overall solar device and efficiently performing maintenance.

Figure 4:
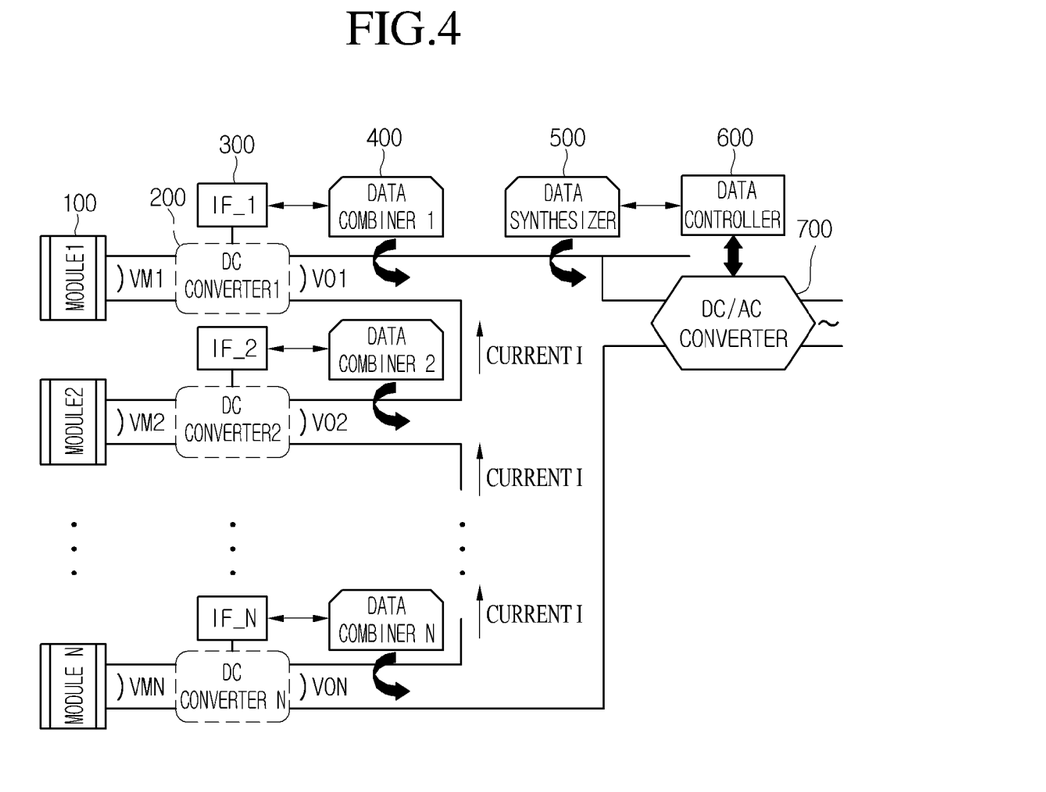
FIG. 4 is a view illustrating a configuration of a solar device according to another embodiment.

FIG. 4 is a view illustrating a configuration of a solar device according to another embodiment.

Referring to FIG. 4, each solar device may include a plurality of solar modules 100, a plurality of DC converters 200, a plurality of interface units 300, a plurality of data combiners 400, a data synthesizer 500, a data controller 600, and a DC/AC converter 700.

As illustrated in FIG. 4, the components of each solar module are connected to one another in a string form, and each solar module 100 may be connected in parallel to form an array.

In an embodiment, the solar module 100 is a module to absorb solar energy and may be a solar cell.

In an embodiment, the solar module 100 may be made of a wafer that is made of silicon.

Each solar module 100 may be located at different positions depending on the sunshine conditions or temperature conditions of each solar device.

The solar module 100 converts and outputs solar energy to electrical energy.

The DC converter 200 uses the output voltage of the solar module 100 and the output voltage of the DC converter 200 to generate and output an output voltage according to a maximum power point by the data controller 600 described below. At this point, the maximum power point may mean a maximum power value that the solar module 100 may supply to loads.

As illustrated in FIG. 4, voltage values that each solar module 100 outputs are represented by Vm1, Vm2, ..., Vmm, and output voltage values so that maximum power may be supplied to loads through the DC converter 200 connected to each solar module 100 in a string form. The output voltage values that the DC converter 200 outputs have been represented by Vo1, Vo2, ..., Von.

The interface unit 300 can receive data on the input voltage value measured by the DC converter 200 and the tracked maximum power point from the DC converter 200 as a digital value and transmit the data to the data combiner 400 described below.

The data combiner 400 adds and transmits data on the solar module 100 to the data received from the interface unit 300.

The data synthesizer 500 removes a DC voltage offset from the data received from each data combiner 400 and transmits the data from which the DC voltage offset has been removed, to the data controller 600.

The data controller 600 can use the data from which the DC voltage offset has been removed, to detect a maximum power point. The maximum power point is used for the overall solar device to supply maximum power to loads, and may mean a maximum power value corresponding to a specific voltage or a maximum power value corresponding to specific current.

The DC/AC converter 700 converts maximum power corresponding to the maximum power point to an alternating current type and supplies the result to loads.

Figure 5:
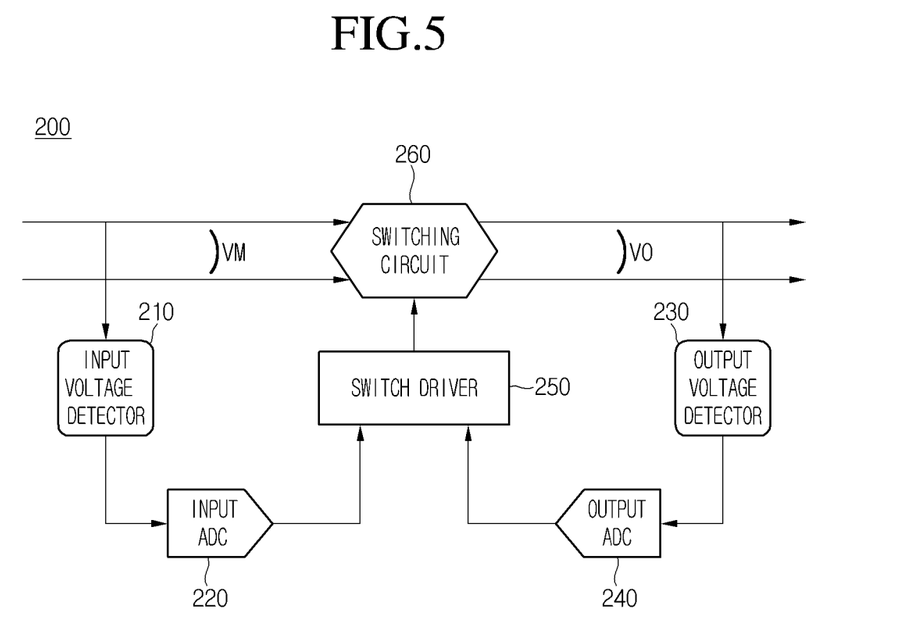
FIG. 5 is a block diagram of a DC converter according to another embodiment.

FIG. 5 is a block diagram of the DC converter 200 according to another embodiment.

Referring to FIG. 5, the DC converter 200 may include an input voltage detector 210, an output voltage detector 230, an input A/D converting unit 220, an output analogue digital converting unit 240, a switch driver 250, and a switching circuit 260.

The input voltage detector 210 detects an input voltage that is output from the solar module 100 and input to the switching circuit 260.

The input A/C converter 220 converts the input voltage detected to a digital signal.

The output voltage detector 230 detects the output voltage of the DC converter 200.

The output A/D converter 240 converts the input voltage detected to a digital signal.

The input voltage and output voltage converted to a digital signal are used for tracking the maximum power point by the data controller described above, so a track control signal for the maximum power point are transferred to the switch driver 250.

The switch driver 250 generates a driving signal for driving the switching circuit 260 to output a voltage value corresponding to the maximum power point and transmits the driving signal to the switching circuit 260.

The switching circuit 260 receives the driving signal from the switch driver 250 and operates to output a voltage value corresponding to the maximum power point.

FIGS. 6A to 6D illustrate various examples of the data combiner 400 according to an embodiment.

The data combiner 400 removes a DC voltage offset from received data including the output voltage value of each DC converter 200, and combines data including information on each solar module 100 to transmit the result to the data controller 600 or receives data from the data controller 600 to transmit the result to the interface unit 300.

For combination, examples of FIGS. 6A to 6D are used.

Figure 6A:
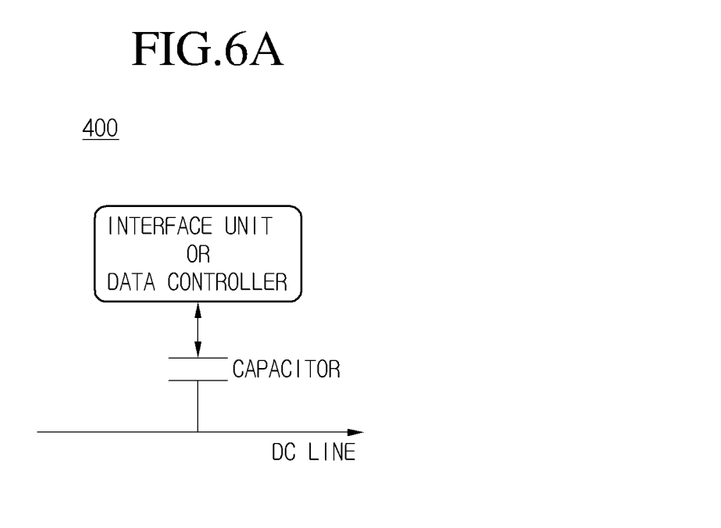
FIGS. 6A and 6D illustrate various examples of a data combiner according to an embodiment.

FIG. 6A illustrates an example of combining data including the output voltage value of each DC converter 200 with data including information on each solar module 100, using a capacitor.

Figure 6B:
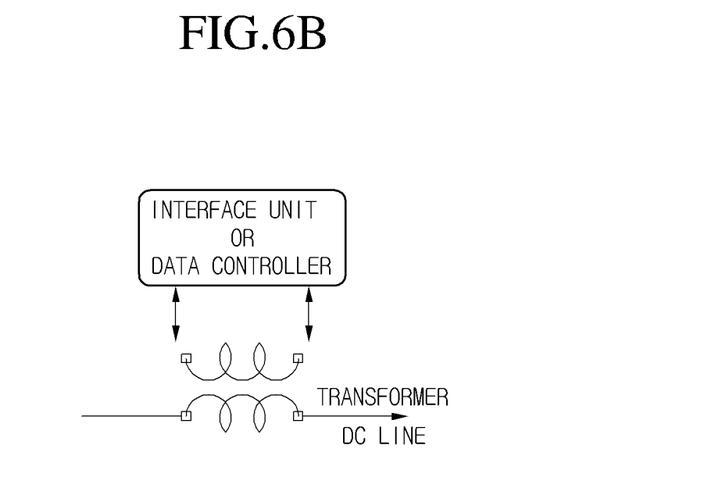

FIG. 6B illustrates an example of combining data including the output voltage value of each DC converter 200 with data including information on each solar module 100, using a transformer.

Figure 6C:
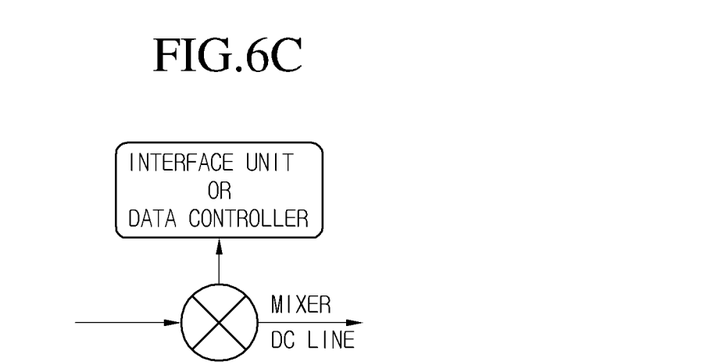

FIG. 6c illustrates an example of combining data including the output voltage value of each DC converter 200 with data including information on each solar module 100, using a mixer.

Figure 6D:
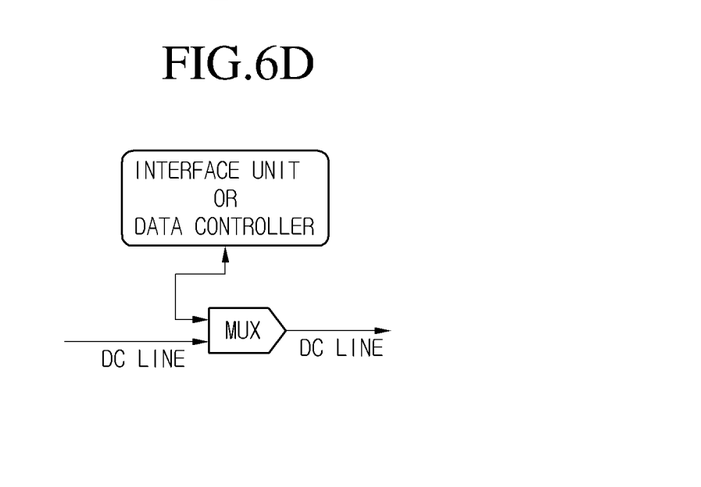

FIG. 6D illustrates an example of combining data including the output voltage value of each DC converter 200 with data including information on each solar module 100, using a multiplexer (MUX).

Figure 7:
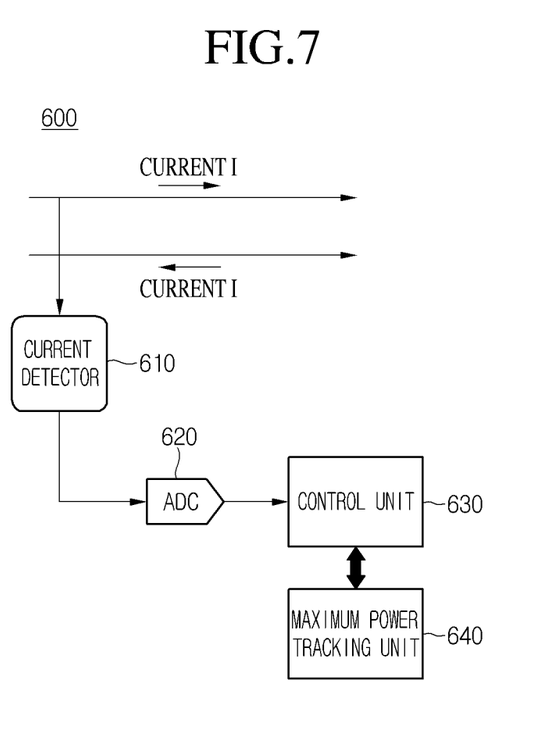
FIG. 7 is a view illustrating a configuration of a data controller according to an embodiment.

FIG. 7 is a view illustrating a configuration of the data controller 600 according to an embodiment.

Referring to FIG. 7, the data controller 600 includes a current detector 610, an A/D converter 620, a control unit 630, and a maximum power tracking unit 640.

The current detector 610 detects current that is output from the DC converter 200.

The A/D converter 620 converts the output current detected to a digital signal.

The control unit 630 multiplies the output voltage (Vo1 to VoN) of each DC converter 200 (1 to N) by the current value I detected by the current detector to calculate power values PM1 to PMN that each solar module 100 outputs. In addition, the control unit collects output voltage values output by each solar module 100 and information on each solar module 100 and controls the maximum power tracking unit 640 to track a maximum power point, a description of which will be made below.

The maximum power tracking unit 640 may use a maximum power tracking algorithm to determine the duty ratio of the switching circuit included in each DC converter 200 to track a maximum power point.

Figure 8:
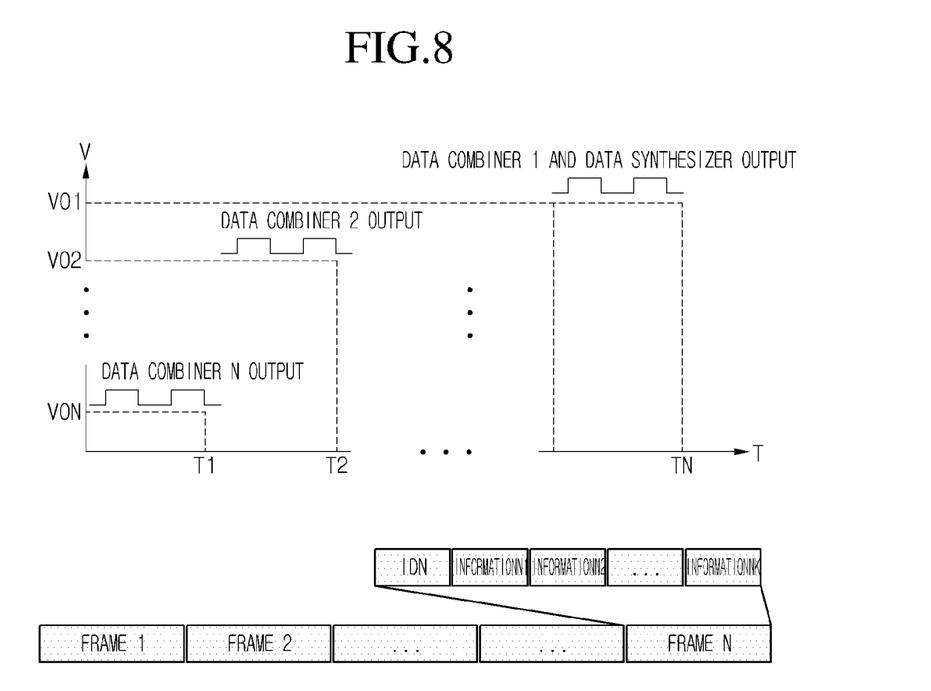
FIG. 8 is a diagram that illustrates how information on each solar module is transmitted through a DC cable line by a data combiner according to an embodiment.

FIG. 8 is a diagram that illustrates how information on each solar module 100 is transferred through a DC cable line by the data combiner 400 according to an embodiment.

In an embodiment, the solar module 100 (N) is detected by a DC converter N 200, is converted to a digital signal by an A/D converter, gets an identifying number (ID) from an interface unit 300 (N), and is formatted to information N1 to NK and frames N. In an embodiment, information N1 to NK may mean information on the output voltage VMN of a solar module 100 (N), the output voltage VON of the DC converter 200, the surface temperatures of the solar module 100 (N), etc. but it not limited thereto.

The formatted frame N is modulated to a digital or analog signal and combined for a time T1 with the DC offset of VON by the data combiner 400. Another solar module 100 is also sequentially formatted by an interface unit 300 in the same method as above and combined for a certain time with a DC voltage offset by each data combiner 400. Potential to which Vo1 to VoN have been added is applied to a DC converter 200 with the highest potential, and a data combiner 400 (1) adds and transmits all pieces of data from the frame 1 to the frame N and, to the data synthesizer 500 through a DC cable line.

The data synthesizer 500 removes a DC voltage offset from received data including the output voltage value of each DC converter 200, synthesizes data including information on each solar module 100, and transmits the result to the data controller 600. Information on each solar module 100 may the output voltage, identifying number of each solar module 100, the surface temperature, sunshine duration, etc. of each solar module 100.

The data controller 600 performs a demodulating process if the received data is an analogue signal, but does not the demodulating process if the received data is a digital signal.

In an embodiment, when transmitting data to the data synthesizer 500 through a DC cable line, whether to transmit an analogue signal or a digital signal may be selectively used depending on a solar device.

The data controller 600 reads data without a DC voltage offset by a control unit and detects current through a current detector. The data controller 600 multiplies the output voltages VM1 to VMN of each solar module 100 or the output voltages Vo1 to VoN of each DC converter 200 (1 to N) by the current value I detected from a current detector to calculate power values PM1 to PMN that each solar module 100 outputs. Information on a power value output by each solar module 100 and on an output voltage value may be used for a user or an administrator to monitor.

The maximum power tracking unit 640 can use the information and use a maximum power tracking algorithm to determine the duty ratio of the switching circuit 260 in each DC converter 200. At this point, the duty ratio means the ratio of values 1 and 0 in a waveform within a cycle of a digital signal and may mean a time interval when the switching circuit 260 is ON or OFF.

The control unit 630 makes information on the duty ratio of each switching circuit 260 included in each DC converter 200 (1 to N), required control signals, etc. as frames N1 to NK as illustrated in FIG. 8 and transmits them to the data combiner 400 as a digital or analogue signal. The data combiner 400 transmits the frame-type data to each data combiner 400 (1 to N) through a DC cable line, and each data combiner 400 (1 to N) offsets DC components from the frame-type data. The data transmitted as a digital form is readily read without a demodulating process, but the information modulated as an analogue signal is demodulated and then read. Each interface unit 300 (1 to N) identifies only a signal corresponding to unique identification (ID) and disregards the rest. Each DC converter 200 performs commands according to the information identified. For example, the output voltages VM1 to VMN of each solar module 100 and the output voltages Vo1 to Vo2 of each DC converter 200 are re-detected simultaneously with being re-adjusted by the duty ratio of the switching circuit 260 in each DC converter 200. The values re-detected are transmitted to the data combiner 500 through each interface unit 300, each data combiner 400, and a DC cable line, and are re-analyzed at the data combiner 600. The duty ratio of each switching circuit 260 is again determined according to a maximum power tracking algorithm by the information re-analyzed, each DC converter 200 is again controlled to adjust the output voltage of each solar module 100 and the output voltage of each DC converter 200, and these processes are repeated until reaching a desired maximum power point.

Figure 9:
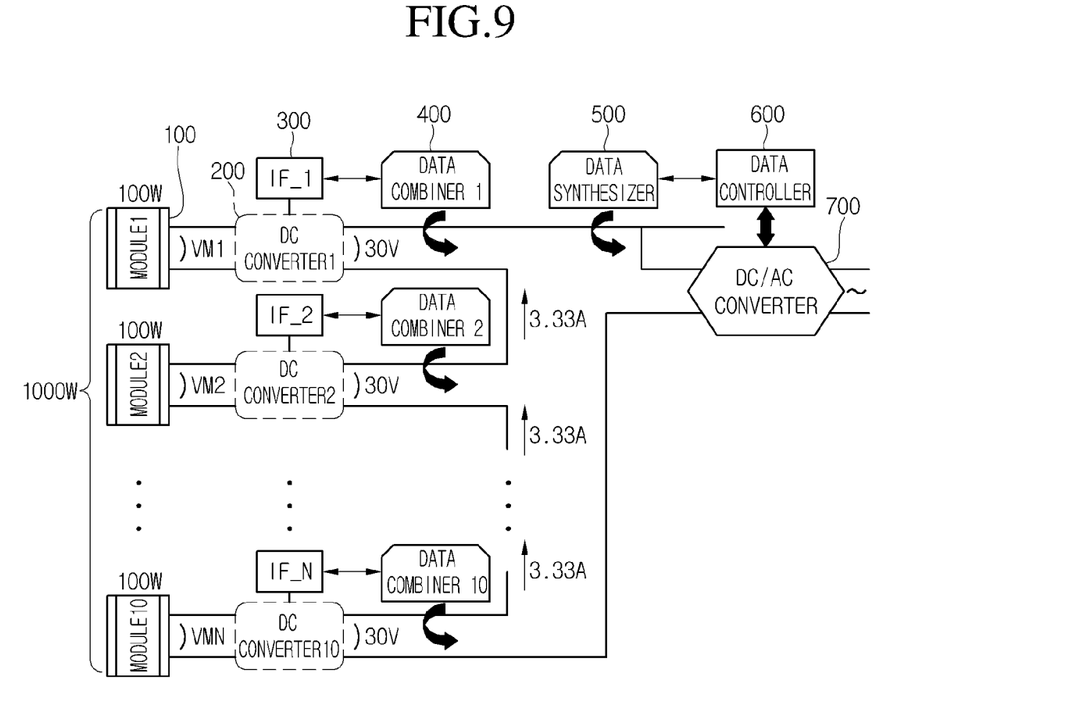
FIGS. 9 to 11 are a diagram illustrating the operational transition of a solar device according to another embodiment.
Figure 10:
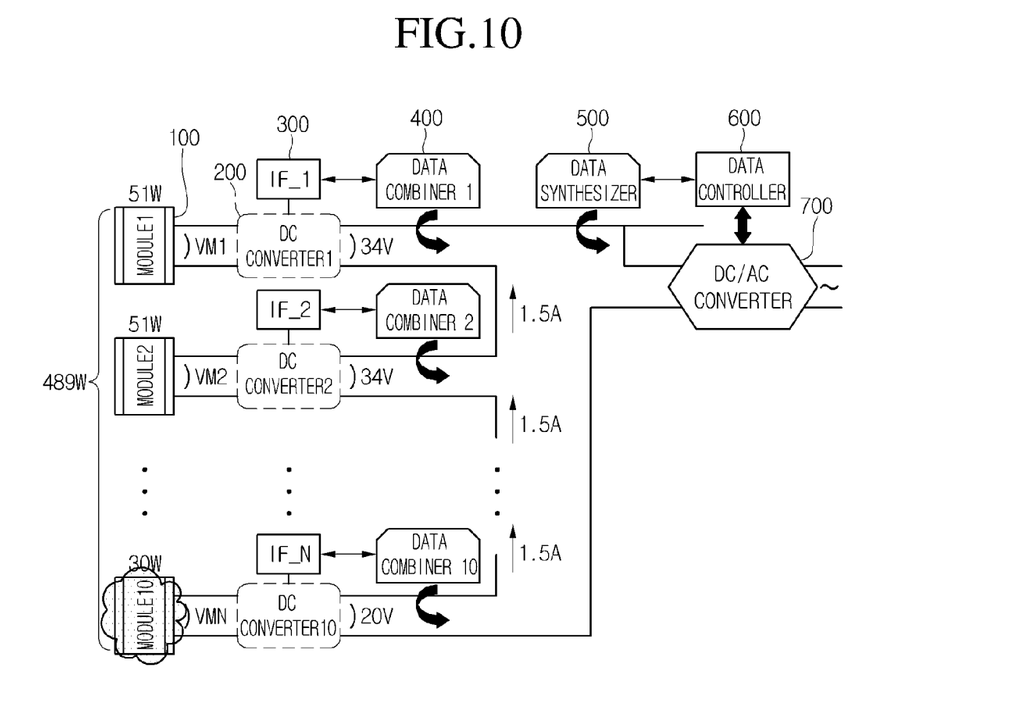
Figure 11:
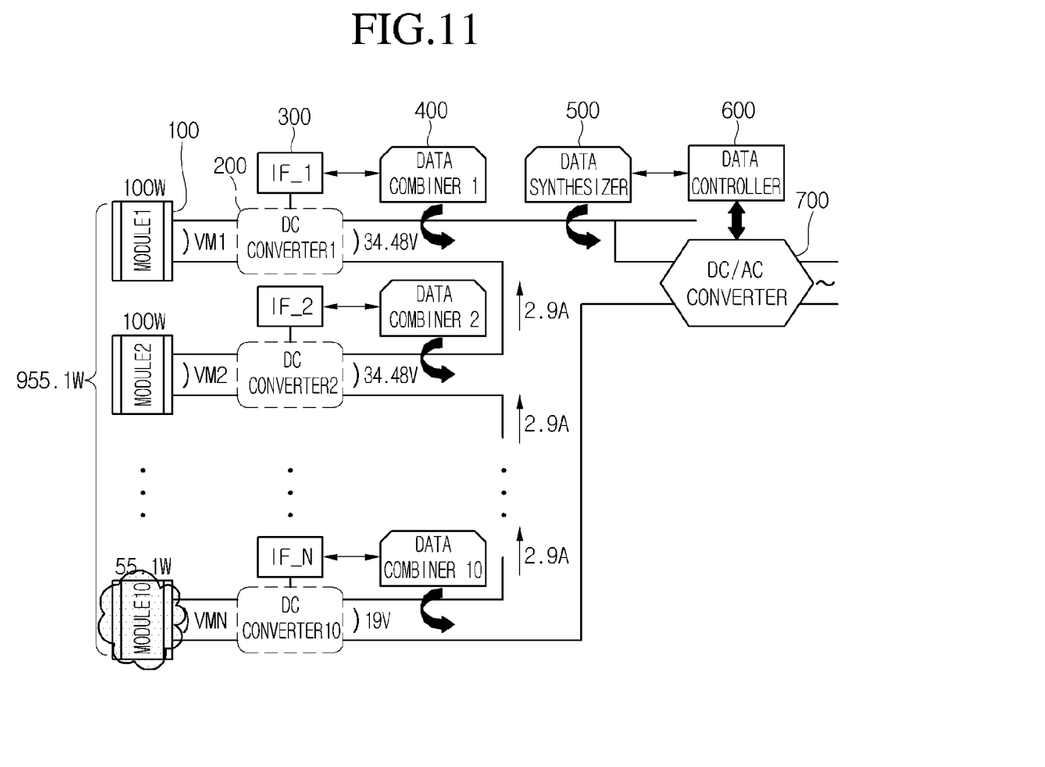

FIGS. 9 to 11 are a diagram illustrating the operational transition of a solar device according to another embodiment.

FIG. 9 illustrates a state when a solar device according to an embodiment erroneously operates, and it is assumed that each solar module 100 equally outputs power corresponding to a maximum power value, about 100 W (on the assumption of disregarding internal consumption power), the output voltage of each DC converter 200 equally is about 30 V, and current flowing in each solar module 100 equally is about 3.3 A.

FIG. 10 is a diagram illustrating a state when the state of a solar device has changed. In particular, this figure contemplates when there is a total of 10 solar modules 100 and the state of the solar module 100 (N) of the 10 solar modules has been changed.

In an embodiment, what the state of a solar device has been may mean that shade has been made at the solar module 100 (10) or its state has changed due to other external factors. Referring to FIG. 10, when the stat of the solar module 100 (10) has changed, at the solar modules 100 (1 to 9), the output voltage of each DC converter 200 has changed from about 30 V to about 34 V, the voltage of the solar module 100 (10) has changed to about 20 V, and current flowing in the solar module 100 (10) has decreased from about 3.33 A to about 1.5 A. Thus, current flowing in the overall solar device has an impact. In other words, current flowing in the overall solar device decreases to about 1.5 A.

Thus, a power value that the solar modules 100 (1 to 9) becomes about 51 W, and power that the solar module 100 (10) becomes about 30 W. As a result, the overall output value that the solar modules 100 (1 to 10) outputs becomes about 489 W, which is a power value decreased by about 511 W compared to the overall solar device of FIG. 9.

In this case, information on the output voltage of each DC converter 200 and a current value flowing in each solar module 100 is transmitted in the same method as mentioned in FIG. 8, and commands are information are received and transmitted until tracking the maximum power point of the solar module 100 (10) by the data controller 600.

FIG. 11 is a diagram illustrating the state of the overall solar device when the maximum power point of the solar module 100 (10) has been detected. Referring to FIG. 11, lastly, the maximum power point of the solar module 100 (10) is re-adjusted to about 19 V and about 2.9 A by the DC converter 10, and at the other solar modules 100 (1 to 9), a voltage is re-adjusted to about 34.48 V to obtain a maximum power point at about 2.9 A. Thus, the total power increases to about 955.1 W.

In other words, since the other solar modules 100 excluding the solar module 100 (10) that there is an error are returned to about 100 W, it may prevent the output power value of the overall solar device from decreasing as in FIG. 10.

In this way, problems can be solved that efficiency decreases due to the mismatch of each solar module 100 or the error of a specific solar module 100 and, as a result, the efficiency of the overall system decreases. Thus, a solar device according to this embodiment may be operated more simply and efficiently than an existing maximum power tracking system. In the same way as above, information including the measured temperature data, overvoltage and overcurrent protection of each solar module 100 and each DC converter 200 are received and commands are re-transferred so that the overall solar device may be monitored or protected.

Figure 12:
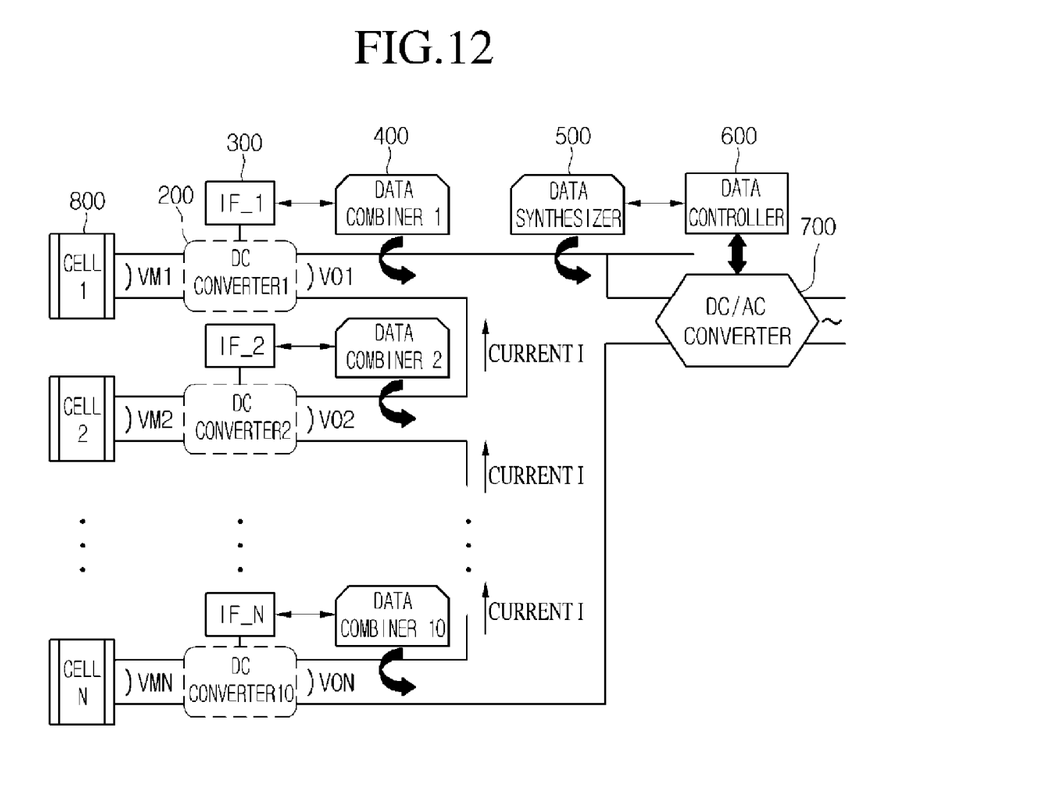
FIG. 12 is a view illustrating a configuration of a solar device where a solar module has been replaced with a battery cell according to an embodiment.

FIG. 12 is a view illustrating a configuration of a solar device where the solar module 100 has been replaced with a battery cell according to an embodiment.

In FIG. 4, each solar module 100 may be replaced with an electric vehicle or a battery cell for charging sunlight. Thus the solar module can also be applied to a battery operating system without a further system.

In addition, although exemplary embodiments of the invention have been illustrated and described above, the invention is not limited to particular embodiments described above. Rather, it is possible for those skilled in the art to make and practice various variations without departing from the principle of the invention claimed in the appended claims. In addition, these variations should not be understood separately from the technical spirit or perspective of the invention.

What is claimed is:

1. A solar device, comprising:
a plurality of solar modules each configured to absorb solar energy and convert the solar energy into electrical energy;
a plurality of DC converters each configured to detect a voltage output from a corresponding solar module and to output a DC voltage corresponding to a local maximum power point using the detected voltage;
a plurality of interface units each configured to transmit a first data signal comprising the voltage detected by a corresponding DC converter and the DC voltage corresponding to the local maximum power point;
a plurality of data combiners each configured to combine a second data signal comprising information of a corresponding solar module with the first data signal from a corresponding interface unit;
a data synthesizer configured to remove a DC voltage offset from a third data signal from each of the plurality of data combiners, the third data signal including the corresponding first data signal and second data signal; and
a data controller configured to track the local maximum power point using each third data signal from which the DC voltage offset has been removed, the data controller comprising:
  a current detector configured to detect current output from each of the plurality of DC converters;
  a controller configured to measure power output from each of the plurality of solar modules using the voltage output of the corresponding DC converter and each detected current and to output a control signal generating a maximum power point based on the corresponding measured power; and
  a maximum power tracking unit configured to receive the output control signal and track the maximum power point, wherein:
the information of each solar module includes a surface temperature of the solar module, a sunshine duration and an identifier of the solar module;
each of the plurality DC converters includes a switching circuit configured to output a new DC voltage corresponding to the local maximum power point using the voltage from the corresponding solar module and the DC voltage from the DC converter;
the data controller is further configured to determine a duty ratio of the switching circuit using the voltage from the solar module and the information of the solar module;
the data combiner is further configured to add a plurality of frames each corresponding to one the plurality of solar modules and the corresponding DC converter and to transmit the plurality of frames to the data synthesizer through a DC cable line;
each of the plurality of frames includes the information of the corresponding solar module and the DC voltage from the corresponding DC converter;
the data controller is further configured to perform a demodulating process if the received data signal from which the DC voltage offset has been removed is an analog signal; and the data controller is further configured to not perform the demodulating process if the received data signal from which the DC voltage offset has been removed is a digital signal.

2. The device according to claim 1, wherein each DC converter, each interface unit, each data combiner, the data synthesizer, and the data controller are connected by the DC cable line.

3. The device according to claim 1, further comprising a DC/AC converter configured to convert maximum power corresponding to the tracked maximum power point to AC power and provide the converted AC power to loads.

4. The device according to claim 1, wherein each DC converter comprises:
   an input voltage detector configured to detect the voltage output from the corresponding solar module; and
   an output voltage detector configured to detect the DC voltage output from the DC converter.

5. The device according to claim 1, wherein each data combiner is further configured to combine data of a DC voltage output by the corresponding DC converter with data of the corresponding solar module.

6. The device according to claim 1, wherein each data combiner is further configured to use a transformer to combine data of the output voltage of the corresponding DC converter with data of the corresponding solar module.

7. The device according to claim 1, wherein each data combiner is further configured to use a mixer to combine data of the output voltage of the corresponding DC converter with data of the corresponding solar module.

8. The device according to claim 1, wherein each data combiner is further configured to use a multiplexer to combine data of the output voltage of the corresponding DC converter with data of the corresponding solar module using.

* * * * *